(12) United States Patent
Handa et al.

(10) Patent No.: US 7,352,555 B2
(45) Date of Patent: Apr. 1, 2008

(54) ELECTROSTATIC CHUCK

(75) Inventors: Ryuichi Handa, Annaka (JP); Akio Nakano, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 283 days.

(21) Appl. No.: 11/293,218

(22) Filed: Dec. 5, 2005

(65) Prior Publication Data

US 2006/0120011 A1   Jun. 8, 2006

(30) Foreign Application Priority Data

Dec. 6, 2004   (JP)   ............... 2004-352515

(51) Int. Cl.
*H01T 23/00*   (2006.01)
(52) U.S. Cl. ..................... 361/234; 361/230
(58) Field of Classification Search ............. 361/230, 361/234
See application file for complete search history.

(56) References Cited

U.S. PATENT DOCUMENTS 6,055,150 A * 4/2000 Clinton et al. .............. 361/234
6,071,630 A   6/2000 Tomaru et al.

FOREIGN PATENT DOCUMENTS

JP   59-64245   4/1984

* cited by examiner

*Primary Examiner*—Michael Sherry
*Assistant Examiner*—Danny Nguyen
(74) *Attorney, Agent, or Firm*—Oblon, Spivak, McClelland, Maier & Neustadt, P.C.

(57) ABSTRACT

Provided is an electrostatic chuck, including: a first insulating layer including a heat conductive silicone rubber with a thermal conductivity of at least 0.2 W/mK, which is formed on top of a metal substrate, either directly or with an adhesive layer disposed therebetween; a conductive pattern, which is formed on top of the first insulating layer, either directly or with an adhesive layer disposed therebetween; a second insulating layer including an insulating polyimide film, which is formed on top of the conductive pattern, either directly or with an adhesive layer disposed therebetween; and a third insulating layer including a heat conductive silicone rubber with a thermal conductivity of at least 0.2 W/mK, a hardness of no more than 85, and a surface roughness of no more than 5 μm, which is formed on top of the second insulating layer, either directly or with an adhesive layer disposed therebetween. Also provided is a process for holding a substrate on the electrostatic chuck. The electrostatic chuck exhibits excellent cooling performance and insulation performance, and is ideal for holding a substrate during the production of a semiconductor integrated circuit.

6 Claims, 2 Drawing Sheets

ELECTROSTATIC CHUCK

BACKGROUND OF THE INVENTION

1. Field of the Invention

The present invention relates to an electrostatic chuck that is useful in the production of semiconductor integrated circuits during steps that require a substrate to be held in position, and particularly during ion injection steps, sputtering steps, and plasma etching steps, and to a process for holding a substrate on the electrostatic chuck.

2. Description of the Prior Art

Conventionally, the holding of a substrate during the production steps for a semiconductor integrated circuit has typically employed a wafer chuck that uses either an electrostatic attachment system or a Johnsen-Rahbek system, that is, a so-called electrostatic chuck. Examples of materials that have been proposed for use as the insulating layer for the chuck include plastics such as polyimides, ceramics such as alumina and aluminum nitride, and rubber elastomers such as silicone rubbers.

Furthermore, in a plasma etching step, a cooling mechanism such as a cooling chiller or the like is usually provided on the underside of the electrostatic chuck in order to enable any heating of the wafer caused by the plasma to be suppressed, and enable the temperature distribution of the wafer to be maintained at a uniform level. By maintaining the temperature distribution at a fixed and uniform level, the selectivity of the chuck for the substrates of the masking material and the target material being etched can be improved, and an anisotropic shape can be more readily obtained, meaning more precise etching can be achieved.

Electrostatic chucks with a ceramic insulating layer exhibit excellent durability to plasma gases and have a high level of thermal conductivity. However, ceramic insulating layers are very hard, meaning they develop only poor contact with the irregular wafer surface, and as a result, the contact heat resistance increases, and satisfactory heat dissipation characteristics cannot be obtained. In order to facilitate heat transfer, the usual practice is to pass an inert gas such as helium between the wafer and the insulating layer. However, this method requires fine processing to form grooves within the insulating layer surface to allow the passage of the inert gas, and also requires a device for supplying the inert gas, meaning the structure of the electrostatic chuck becomes significantly more complex, which leads to increases in the production costs for the electrostatic chuck.

Electrostatic chucks that use a polyimide insulating layer are inexpensive and easy to produce, but provide inadequate durability relative to plasma gases. Furthermore, the thermal conductivity is low and the insulating layer is hard, meaning the contact heat resistance is large and the heat dissipation characteristics are poor.

The patent reference 1 proposes an electrostatic chuck comprising a metallic plate, on which is provided a first insulating film comprising a heat-dissipating silicone prepreg obtained by impregnating a glass cloth with a silicone rubber, a copper pattern formed on top of the first insulating film as electrodes, and a second insulating film comprising a silicone rubber formed on top of the copper pattern. Because this electrostatic chuck uses silicone rubber elastomers for the insulating layers, the contact heat resistance is comparatively small, and the heat dissipation characteristics are favorable. Accordingly, using this electrostatic chuck enables the temperature of the wafer to be efficiently maintained at a uniform level. However, in recent years the demands have grown for electrostatic chucks capable of cooling even higher wafer temperatures, and even an electrostatic chuck of the structure disclosed in the patent reference 1 is unable to provide adequate cooling performance.

In addition, the patent reference 2 proposes an electrostatic chuck comprising a first insulating layer, which comprises a heat conductive silicone rubber with a thermal conductivity of at least 0.2 W/mK, and is formed on top of a metal substrate, a conductive pattern which is formed on top of the first insulating layer as electrodes, and a second insulating layer comprising a heat conductive silicone rubber with a thermal conductivity of at least 0.2 W/mK, a hardness measured by a JIS-A hardness meter of no more than 85, and a surface roughness of no more than 5 µm, and this electrostatic chuck exhibits excellent heat dissipation characteristics, and enables the wafer temperature to be precisely maintained at a uniform level. However, with this electrostatic chuck, there is some concern about insulation abnormalities within the second insulating layer caused by factors such as the incorporation of sputtered metals.

[Patent Reference 1] JP59-64245A

[Patent Reference 2] U.S. Pat. No. 6,071,630

SUMMARY OF THE INVENTION

The present invention takes the above circumstances into consideration, with an object of providing an electrostatic chuck which exhibits excellent cooling performance and insulation performance, and is ideal for holding a substrate during the production of a semiconductor integrated circuit. Another object of the present invention is to provide a process for holding a substrate on the electrostatic chuck.

In order to achieve the above object, the present invention provides an electrostatic chuck comprising:

a first insulating layer comprising a heat conductive silicone rubber with a thermal conductivity of at least 0.2 W/mK, which is formed on top of a metal substrate, either directly or with an adhesive layer disposed therebetween, a conductive pattern, which is formed on top of the first insulating layer, either directly or with an adhesive layer disposed therebetween, a second insulating layer comprising an insulating polyimide film, which is formed on top of the conductive pattern, either directly or with an adhesive layer disposed therebetween, and a third insulating layer comprising a heat conductive silicone rubber with a thermal conductivity of at least 0.2 W/mK, a hardness of no more than 85, and a surface roughness of no more than 5 µm, which is formed on top of the second insulating layer, either directly or with an adhesive layer disposed therebetween. The present invention also provides a process for holding a substrate on the electrostatic chuck.

An electrostatic chuck of the present invention exhibits excellent heat dissipation characteristics and insulation performance, and also provides excellent contact with the substrate. Accordingly, in those steps during semiconductor integrated circuit production that require a substrate to be held in position, and particularly during plasma etching steps, the temperature of the wafer can be precisely maintained at a uniform temperature, meaning highly precise etching can be achieved. Furthermore, in sputtering steps, insulation abnormalities caused by factors such as incorporation of sputtered metals can be effectively prevented.

DETAILED DESCRIPTION OF THE PREFERRED EMBODIMENTS

As follows is a detailed description of the present invention. In the present invention, "hardness" refers to the hardness measured using a spring-type hardness tester (Type A) prescribed in JIS K 6301, and "surface roughness" refers to the center line average roughness (Ra) prescribed in JIS B 0601-1982.

Figure 1:
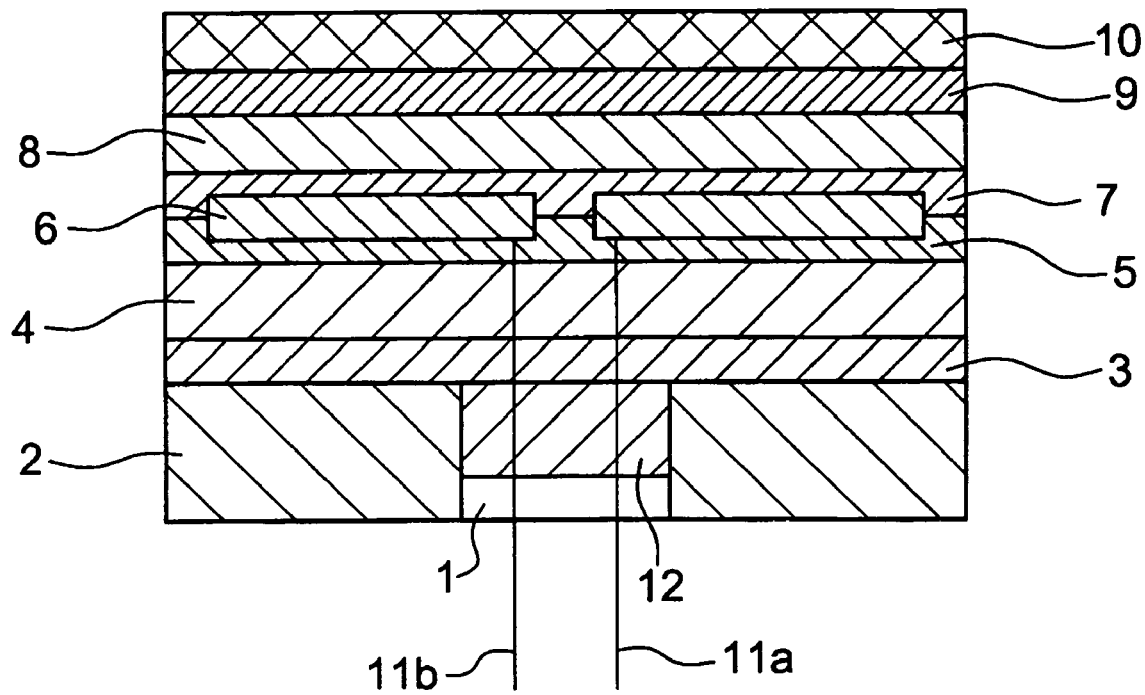
FIG. 1 is a longitudinal sectional view showing one example of an electrostatic chuck of the present invention.
Figure 2:
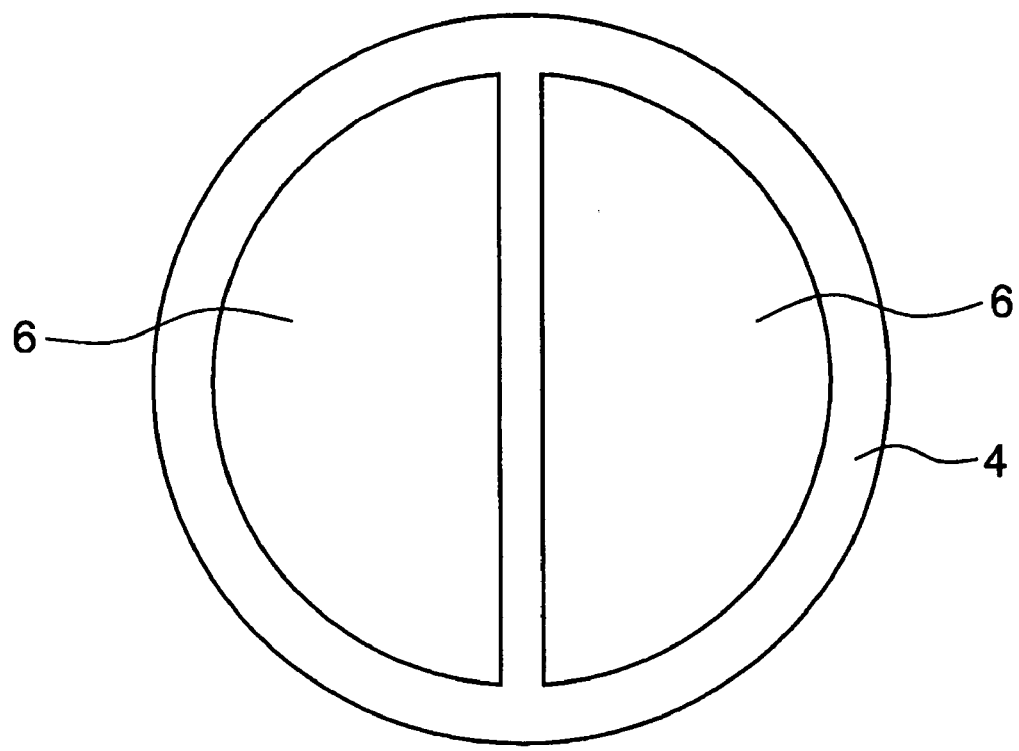
FIG. 2 is a plan view showing a conductive pattern disposed on top of a first insulating layer used in the electrostatic chuck of FIG. 1, showing the state prior to the formation of an adhesive layer and other upper layers on top of this conductive pattern.

FIG. 1 is a longitudinal sectional view showing one example of an electrostatic chuck of the present invention. In FIG. 1, a first insulating layer 4 comprising a heat conductive silicone rubber is provided on top of a circular disc-shaped metal substrate 2 having a central aperture 1, with an adhesive layer 3 disposed therebetween, and a conductive pattern 6 that is formed as electrodes is provided on top of the first insulating layer 4 with an adhesive layer 5 disposed therebetween. FIG. 2 is a plan view showing a schematic illustration of the conductive pattern 6 disposed on top of the first insulating layer 4, prior to formation of an adhesive layer 7 and other upper layers. As is evident from FIG. 2, in this example, the conductive pattern 6 comprises two semicircular patterns. In FIG. 1, a second insulating layer 8 comprising an insulating polyimide film is provided on top of the conductive pattern 6, with the adhesive layer 7 disposed therebetween. A third insulating layer 10 comprising a heat conductive silicone rubber is then provided on top of the second insulating layer 8, with an adhesive layer 9 disposed therebetween. The third insulating layer 10 has a thermal conductivity of at least 0.2 W/mK, a hardness of no more than 85, and a surface roughness of no more than 5 μm.

Lead wires 11a and 11b from the two conductive patterns 6 pass through the adhesive layer 5, the first insulating layer 4, and the adhesive layer 3, and are drawn out through the central aperture 1 of the metal substrate 2. The lead wires 11a and 11b are conductive wires used for supplying a voltage from a power supply to the conductive pattern 6 of the electrostatic chuck, and are connected to the respective conductive patterns 6 by soldering. The voltage applied to an electrostatic chuck of the present invention is typically within a range from 0 to ±4,000 V, and in the test of insulation performance, is within a range from 0 to ±10 kV Accordingly, the lead wires 11a and 11b are preferably coated with a fluororesin with an excellent dielectric withstand voltage (such as PTFE, FEP or PFA).

Furthermore, in order to ensure adequate insulation between the metal substrate 2, and the lead wires 11a and 11b and the conductive pattern 6, a sealing agent 12 is used to fill the aperture 1. Examples of suitable materials for the sealing agent 12 include conventional silicone-based, epoxy-based, or polyimide-based sealing agents, although this is not a restrictive list.

[Metal Substrate]

The metal substrate functions as a high frequency power supply electrode, and a plasma is generated by applying a voltage to this metal substrate. The metal substrate preferably exhibits favorable durability relative to plasma gases, and preferably does not contaminate the semiconductor circuit through dust generation. Suitable materials for the metal substrate include aluminum, alumite, and duralmin.

[First Insulating Layer]

The first insulating layer comprises a heat conductive silicone rubber with a thermal conductivity of at least 0.2 W/mK, and preferably 0.5 W/mK or greater, and most preferably 1 W/mK or greater. If this thermal conductivity is too low, then the insulating layer may not be able to suppress increases in the temperature of the wafer caused by the heat supplied by the plasma. In such cases, maintaining the temperature of the wafer at a constant level becomes difficult, making highly precise etching impossible. Furthermore, provided the silicone rubber characteristics of the layer are retained, higher thermal conductivity values are preferred, and heat conductive silicone rubbers with thermal conductivities of 10 W/mK or even 20 W/mK can also be favorably employed. There are no particular restrictions on the hardness or surface roughness of the heat conductive silicone rubber used for the first insulating layer.

The heat conductive silicone rubber is, for example, preferably a cured product of a silicone rubber composition containing a thermal conductivity imparting agent. The uncured silicone rubber composition may be either a millable silicone rubber composition or a liquid silicone rubber composition. Moreover, the uncured silicone rubber composition may be a peroxide curing composition, an addition reaction curing composition, a condensation curing composition, or an ultraviolet light curing composition or the like, although this is not a restrictive list. Of these, peroxide curing and addition reaction curing silicone rubber compositions are preferred in terms of their workability and moldability, and peroxide curing or addition reaction curing millable silicone rubber compositions are particularly desirable.

Examples of suitable peroxide curing silicone rubber compositions include organopolysiloxanes containing two or more alkenyl groups bonded to silicon atoms within each molecule, and more specifically, silicone rubber compositions in which a straight-chain organopolysiloxane containing alkenyl groups such as vinyl groups at either the molecular chain terminal positions (either one or both terminals) and/or non-terminal positions within the molecular chain is cured by radical polymerization in the presence of an organic peroxide.

Examples of suitable addition reaction curing silicone rubber compositions include silicone rubber compositions in which an alkenyl group-containing straight-chain organopolysiloxane such as that described above and an organohydrogenpolysiloxane are cured by reaction (a hydrosilylation addition reaction) in the presence of a platinum group metal-based catalyst.

Examples of suitable condensation curing silicone rubber compositions include silicone rubber compositions in which an organopolysiloxane with both terminals blocked with silanol groups, and a hydrolysable silane such as a tetraalkoxysilane, an organotrialkoxysilane, and/or a partial hydrolysis-condensation product thereof are cured by reaction in the presence of a condensation reaction catalyst such as an organotin-based catalyst, or alternatively, silicone rubber compositions in which an organopolysiloxane with both terminals blocked with alkoxy-containing siloxy groups or alkoxy-containing siloxyalkyl groups such as trialkoxysiloxy groups, dialkoxyorganosiloxy groups, trialkoxysiloxyethyl groups, or dialkoxyorganosiloxyethyl groups is cured by reaction in the presence of a condensation reaction catalyst such as an organotin-based catalyst.

Examples of suitable ultraviolet light curing silicone rubber compositions include silicone rubber compositions which are cured by ultraviolet energy with a wavelength of 200 to 400 nm. In these cases, there are no particular restrictions on the curing mechanism. Specific examples include acrylic silicone-based silicone rubber compositions comprising an organopolysiloxane containing an acrylic group or methacrylic group, and a photopolymerization initiator, mercapto-vinyl addition polymerization type silicone rubber compositions comprising an organopolysiloxane containing a mercapto group, an organopolysiloxane containing an alkenyl group such as a vinyl group, and a photopolymerization initiator, addition reaction curing silicone rubber compositions that use the same platinum group metal-based catalysts as the heat curing addition reaction compositions, and cationic polymerization type silicone rubber compositions comprising an organopolysiloxane containing an epoxy group and an onium salt catalyst, and any of these compositions can be used as an ultraviolet light curing silicone rubber composition.

Examples of thermal conductivity imparting agents capable of imparting thermal conductivity to silicone rubber include alumina, silicon nitride, aluminum nitride, boron nitride, magnesium oxide, and quartz powder. These thermal conductivity imparting agents can be used either alone, or in combinations of two or more different materials.

Furthermore, conventional additives including reinforcing fillers (such as silica and the like), colorants, and flame retardancy imparting agents may also be added to the heat conductive silicone rubber. These additives can be used either alone, or in combinations of two or more different materials.

The thickness of the first insulating layer is preferably within a range from 50 to 1,000 μm, and even more preferably from 300 to 800 μm. Provided the thickness falls within this range, the dielectric withstand voltage of the first insulating layer can be maintained, meaning the probability of dielectric breakdown occurring within the electrostatic chuck is reduced, and ensuring favorable heat dissipation characteristics for the electrostatic chuck.

The first insulating layer is either formed directly on top of the metal substrate, or is formed (laminated) on the metal substrate with an adhesive layer disposed therebetween, as shown in FIG. 1. In the former case, the first insulating layer is simply brought into direct contact with the metal substrate. In the latter case, the adhesive layer preferably comprises either an adhesive such as a silicone rubber-based adhesive or an acrylic-based adhesive, or a primer containing a silane coupling agent or a titanium-based coupling agent. In such a case, the first insulating layer is bonded to the metal substrate by this type of adhesive or primer.

The thickness of the adhesive layer is preferably within a range from 0.1 to 30 μm. Provided the thickness falls within this range, the heat dissipation characteristics of the electrostatic chuck can be maintained at a favorable level, with no reduction in the thermal conductivity of the adhesive layer.

In order to improve the thermal conductivity, thermal conductivity imparting agents such as alumina, silicon nitride, aluminum nitride, boron nitride, magnesium oxide, and quartz powder may also be added to the adhesive layer. These thermal conductivity imparting agents can be used either alone, or in combinations of two or more different materials.

[Conductive Pattern]

The conductive pattern functions as the electrodes when the electrostatic chuck is used for holding a wafer. Suitable materials for the conductive pattern include metals such as copper, aluminum, nickel, silver, and tungsten; and conductive ceramics such as titanium nitride.

The thickness of the conductive pattern is preferably within a range from 1 to 100 μm, and even more preferably from 5 to 50 μm. Provided the thickness falls within this range, the mechanical strength of the conductive pattern can be ensured, meaning damage to the conductive pattern, either during the steps of laminating the second insulating layer and the third insulating layer, or during the step of soldering the voltage supply lead wires to the conductive pattern, can be prevented, and moreover, the mechanical strength and electrical performance of the conductive pattern can be ensured without requiring an excessively thick pattern, which is beneficial from a materials cost perspective.

The conductive pattern may be either unipolar or multipolar. An example of a multipolar conductive pattern is the bipolar conductive pattern shown in FIG. 2.

The conductive pattern is either formed directly on top of the first insulating layer, or is formed (laminated) on the first insulating layer with an adhesive layer disposed therebetween, as shown in FIG. 1. The composition and thickness of the adhesive layer may be the same as the adhesive layer provided between the metal substrate and the first insulating layer.

[Second Insulating Layer]

The second insulating layer comprises an insulating polyimide film. By providing this second insulating layer, the occurrence of insulation abnormalities can be suppressed, even if sputtered metals become incorporated between the electrostatic chuck of the present invention and the wafer.

Examples of the insulating polyimide film used for forming the second insulating layer include Kapton (a registered trademark) (brand name, manufactured by DuPont-Toray Co., Ltd.), Apical (a registered trademark) (brand name, manufactured by Kaneka Corporation), and Upilex (a registered trademark) (manufactured by Ube Industries, Ltd.).

The thickness of the second insulating layer is preferably within a range from 5 to 50 μm, and even more preferably from 7.5 to 25 μm. Provided the thickness falls within this range, the dielectric withstand voltage of the second insulating layer can be maintained, meaning the probability of dielectric breakdown occurring within the electrostatic chuck is reduced, and ensuring favorable heat dissipation characteristics for the electrostatic chuck.

The second insulating layer is either formed directly on top of the conductive pattern, or is formed (laminated) on the conductive pattern with an adhesive layer disposed therebetween, as shown in FIG. 1. The composition and thickness of the adhesive layer may be the same as the adhesive layer provided between the metal substrate and the first insulating layer.

[Third Insulating Layer]

The third insulating layer is identical to the first insulating layer, with the exception of the points described below.

The thermal conductivity of the heat conductive silicone rubber used in the third insulating layer is at least 0.2 W/mK, and is preferably 0.5 W/mK or greater. Furthermore, the hardness of the heat conductive silicone rubber used in the third insulating layer is typically no more than 85, and preferably within a range from 50 to 80. In addition, the surface roughness of the heat conductive silicone rubber used in the third insulating layer is typically no more than 5 μm, and preferably no more than 2 μm. If the hardness exceeds 85, and/or the surface roughness is larger than 5 μm, then the ability of the third insulating layer to make close contact with the wafer deteriorates, causing an increase in the contact heat resistance at the interface between the insulating layer and the wafer, and as a result, the electrostatic chuck of the present invention may become unable to precisely maintain the temperature of the wafer at a uniform level.

Because the heat conductive silicone rubber used in the third insulating layer comes into direct contact with the wafer, in order to prevent contamination of the wafer, the third insulating layer preferably contains absolutely minimal quantities of conductive impurities, including alkali metals, alkaline earth metals, heavy metals such as iron, nickel, copper, and chromium, and compounds of these metals. Specifically, the quantity of conductive impurities, reported as a mass referenced quantity of metal elements, is preferably no more than 1 ppm.

The third insulating layer is either formed directly on top of the second insulating layer, or is formed (laminated) on the second insulating layer with an adhesive layer disposed therebetween, as shown in FIG. 1. The composition and thickness of the adhesive layer may be the same as the adhesive layer provided between the metal substrate and the first insulating layer.

[Adhesive Layers]

As disclosed above in the descriptions of each of the insulating layers and the conductive pattern, the adhesive layer between the metal substrate and the first insulating layer, the adhesive layer between the first insulating layer and the conductive pattern, the adhesive layer between the conductive pattern and the second insulating layer, and the adhesive layer between the second insulating layer and the third insulating layer, when formed, each comprise, independently, an adhesive such as a silicone rubber-based adhesive or an acrylic-based adhesive, or a primer containing a silane coupling agent or a titanium-based coupling agent, and the thickness of each of these adhesive layers is preferably within a range from 0.1 to 30 μm. Provided the thickness falls within this range, the heat dissipation characteristics of the electrostatic chuck can be maintained at a favorable level, with no reduction in the thermal conductivity of the adhesive layer. Furthermore, in order to improve the thermal conductivity, the adhesive layer may also include a thermal conductivity imparting agent such as alumina, silicon nitride, aluminum nitride, boron nitride, magnesium oxide, or quartz powder. These thermal conductivity imparting agents can be used either alone, or in combinations of two or more different materials.

[Application for Electrostatic Chuck]

An electrostatic chuck of the present invention is useful for holding a substrate in position in the production of semiconductor integrated circuits. A substrate can be held in position using the electrostatic chuck of the present invention by a process comprising the steps of:

providing the electrostatic chuck of the present invention, positioning the substrate on the surface of the third insulating layer opposite to the second layer, and supplying a voltage to the conductive pattern, thereby holding the substrate on the electrostatic chuck. The substrate held on the electrostatic chuck can be detached by stopping the supplied voltage. Examples of the substrate include a wafer such as a silicon wafer.

EXAMPLES

As follows is a description of specifics of the present invention based on a series of examples and comparative examples, although the present invention is in no way limited to these examples.

Example 1

An electrostatic chuck with the structure shown in FIG. 1 was produced in the manner described below.

A primer No. 24T (a product name, manufactured by Shin-Etsu Chemical Co., Ltd.) was applied by brush, as an adhesive, to one surface of electrolytic copper foil (thickness: 35 μm), and the primer was air dried for 30 minutes at room temperature, yielding an adhesive layer 5 (thickness: 10 μm). The adhesive layer 5, and a first insulating layer 4 comprising an unvulcanized sheet of a heat conductive silicone rubber TC-65BG (a product name, manufactured by Shin-Etsu Chemical Co., Ltd., thickness: 650 μm, thermal conductivity: 4 W/mK) containing added boron nitride were then bonded together and subjected to press bonding under conditions including a pressure of 4 MPa, a temperature of 170° C., and a bonding time of 10 minutes. Subsequently, the electrolytic copper foil was chemically etched, thereby completing formation of a conductive pattern 6 (copper electrodes) of the shape shown in FIG. 2 on top of the first insulating layer 4.

Next, a liquid silicone-based adhesive KE1825 (a product name, manufactured by Shin-Etsu Chemical Co., Ltd.) was applied by screen printing, with a thickness of 25 μm, to the conductive pattern side of the above laminated composite sheet comprising the first insulating layer 4 and the conductive pattern 6, thus yielding an adhesive layer 7. The adhesive layer 7, and a second insulating layer 8 comprising a polyimide film (brand name: Kapton (a registered trademark), manufactured by DuPont-Toray Co., Ltd.) of thickness 12.5 μm were then bonded together and subjected to press bonding under conditions including a pressure of 4 MPa, a temperature of 120° C., and a bonding time of 10 minutes, thereby yielding a laminated composite sheet comprising the first insulating layer 4, the conductive pattern 6, and the second insulating layer 8.

Subsequently, a primer C (a product name, manufactured by Shin-Etsu Chemical Co., Ltd.) was applied by brush, as an adhesive, to the polyimide film surface of the above laminated composite sheet, and the primer was then air dried for 15 minutes at room temperature, yielding an adhesive layer 9 (thickness: 2 μm). The adhesive layer 9, and a third insulating layer 10 comprising an unvulcanized sheet of a heat conductive silicone rubber TC-20A (a product name, manufactured by Shin-Etsu Chemical Co., Ltd., thickness: 200 μm, thermal conductivity: 1.1 W/mK, hardness: 70, surface roughness: 2 μm) containing added alumina were then bonded together and subjected to press bonding under conditions including a pressure of 4 MPa, a temperature of 170° C., and a bonding time of 10 minutes, thereby yielding a laminated composite sheet comprising the first insulating layer 4, the conductive pattern 6, the second insulating layer 8, and the third insulating layer 10.

Next, the aforementioned liquid silicone-based adhesive KE1825 was applied to an aluminum substrate 2, by screen printing at a thickness of 25 μm, thus forming an adhesive layer 3. The adhesive layer 3 and the first insulating layer 4 side of the above laminated composite sheet were then bonded together and subjected to press bonding under conditions including a pressure of 2 MPa, a temperature of 120° C., and a bonding time of 30 minutes, thereby yielding a laminated composite sheet comprising the aluminum substrate 2, the first insulating layer 4, the conductive pattern 6, the second insulating layer 8, and the third insulating layer 10.

Finally, PTFE-coated electrical wires 11a and 11b were soldered to the conductive pattern 6 of the laminated composite sheet, the aperture 1 was filled using an epoxy-based sealing agent Semicoat 114A (a product name, manufactured by Shin-Etsu Chemical Co., Ltd.) as the sealing agent 12, and the sealing agent was cured at 120° C. for 5 hours, completing production of the electrostatic chuck.

Example 2

With the exceptions of altering the conditions in the manner described below, an electrostatic chuck was produced in the same manner as the example 1.

Instead of the electrolytic copper foil (thickness: 35 μm), aluminum foil (thickness: 50 μm) was used.

For the adhesive layer 7 and the adhesive layer 3, instead of the liquid silicone-based adhesive KE1825, a liquid silicone-based adhesive KE1800ABC (a product name, manufactured by Shin-Etsu Chemical Co., Ltd.) was used.

Instead of the second insulating layer 8 comprising a polyimide film of thickness 12.5 μm, a second insulating layer 8 comprising a polyimide film of thickness 25 μm (brand name: Apical (a registered trademark), manufactured by Kaneka Corporation) was used.

Instead of the third insulating layer 10 comprising an unvulcanized sheet of the heat conductive silicone rubber TC-20A containing added alumina, a third insulating layer 10 comprising an unvulcanized sheet of a heat conductive silicone rubber A (thickness: 250 μm, thermal conductivity: 0.9 W/mK, hardness: 65, surface roughness: 3 μm) produced by blending 100 parts by mass of an organopolysiloxane (composition: a methylvinylpolysiloxane with an average polymerization degree of 8,000 comprising 99.85 mol % of dimethylsiloxane units and 0.15 mol % of methylvinylsiloxane units) with 250 parts by mass of spherical silica and 0.5 parts by mass of 2,5-dimethyl-2,5-bis(t-butylperoxy)-hexane was used.

Instead of the aluminum substrate 2, an aluminum substrate 2 that had been surface treated with alumite was used.

Instead of the PTFE-coated electrical wires 11a and 11b, PFA-coated electrical wires 11a and 11b were used.

For the sealing agent 12, instead of the epoxy-based sealing agent Semicoat 114A, a silicone-based sealing agent KJR632 (a product name, manufactured by Shin-Etsu Chemical Co., Ltd.) was used.

Example 3

With the exception of using a heat conductive silicone rubber-based adhesive KE1862 (a product name, manufactured by Shin-Etsu Chemical Co., Ltd.) instead of the liquid silicone-based adhesive KE1825 for forming the adhesive layer 7 and the adhesive layer 3, an electrostatic chuck was produced in the same manner as the example 1.

[Evaluation of the Electrostatic Chucks of the Examples 1 to 3]

(Cooling Performance)

Figure 3:
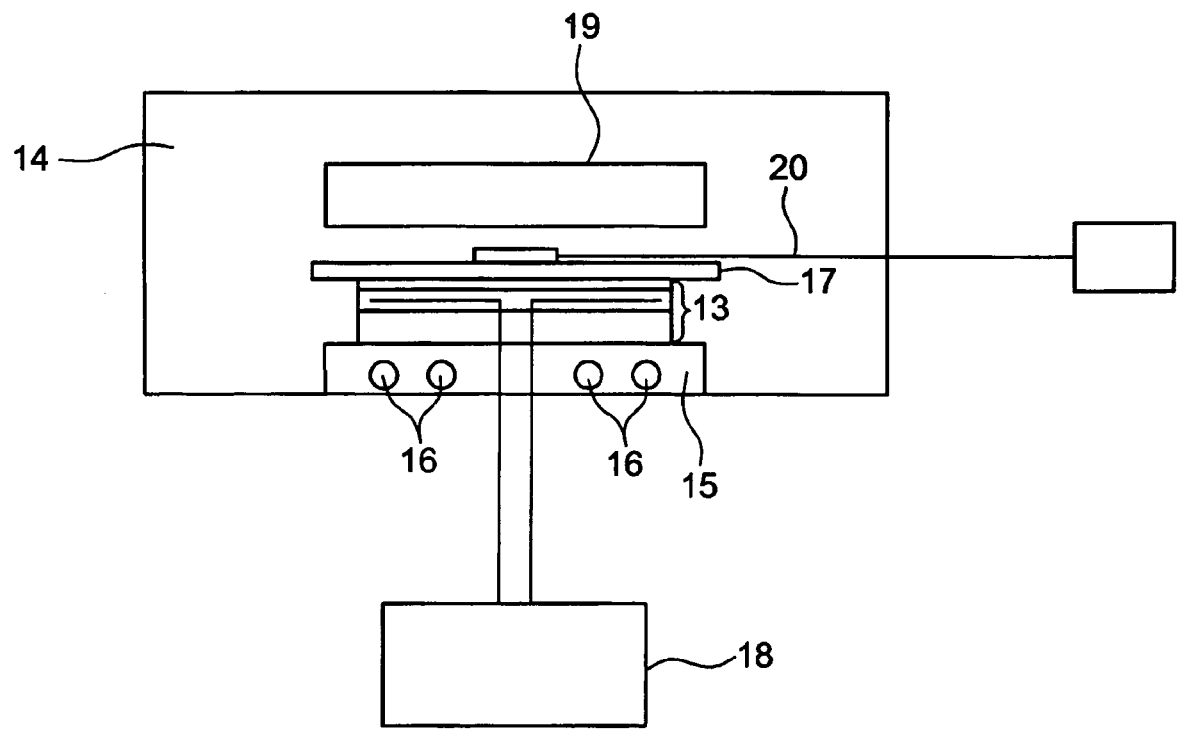
FIG. 3 is a longitudinal sectional view showing an outline of the construction of a cooling performance tester used for evaluating the cooling performance of electrostatic chucks in the examples.

The cooling performance of each of the electrostatic chucks produced in the examples 1 to 3 was evaluated. A cooling performance tester was used for conducting the evaluations. FIG. 3 is a longitudinal sectional view showing an outline of the construction of the cooling performance tester. In FIG. 3, an electrostatic chuck 13 was mounted on top of a platform 15 inside a chamber 14. The platform 15 was provided with cooling pipes 16 through which cooling water was circulated, thereby cooling the electrostatic chuck 13. A wafer 17 was positioned on top of the electrostatic chuck 13, and the pressure inside the chamber 14 was reduced to 0.01 Torr. Subsequently, a direct current voltage of ±0.5 kV was supplied to the electrostatic chuck 13 from a power supply 18, thereby securing the wafer 17 on top of the electrostatic chuck 13 by electrostatic attachment.

Subsequently, a heater 19 was used to heat the wafer 17 to 150° C., and cooling water at 4° C. was then circulated through the cooling pipes 16. Once the temperature of the wafer 17 reached a state of equilibrium, the temperature at the surface of the wafer 17 was measured using a surface thermometer 20. The results are shown in Table 1.

(Plasma Resistance)

If an electrostatic chuck deteriorates in the presence of a plasma, then the wafer cooling performance deteriorates, which causes bias to develop in the wafer temperature and the temperature distribution, meaning the resist pattern formed on the wafer surface can become damaged. Accordingly, the plasma resistance of each of the electrostatic chucks obtained in the examples 1 to 3 was evaluated by repeatedly conducting a silicon wafer plasma etching treatment under specific conditions, and counting the number of wafers that could be treated without causing any damage to the resist pattern formed on the wafer surface.

Following mounting of the electrostatic chuck in the plasma etching apparatus, a mixed gas of $CF_4$ and $O_2$ (($P_{O_2}$/total pressure)=10%) was used as the reaction gas, and 2,000 silicon wafers were subjected to plasma etching treatment under conditions including a temperature of 70° C., a pressure of 0.8 Torr, a microwave input power of 400 W, and a treatment time of 60 seconds per wafer. The results revealed that no resist damage occurred as a result of wafer temperature increase or variation in the temperature distribution, meaning the wafers were able to be processed with a favorable anisotropic shape.

(Insulation Performance)

Figure 4:
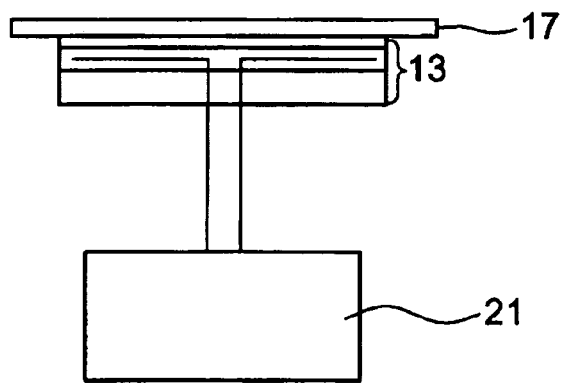
FIG. 4 is a longitudinal sectional view showing an outline of the construction of a withstand voltage tester used for evaluating the insulation performance of electrostatic chucks in the examples.

The insulation performance of each of the electrostatic chucks produced in the examples 1 to 3 was evaluated. A withstand voltage tester was used for the evaluations. FIG. 4 is a longitudinal sectional view showing an outline of the construction of the withstand voltage tester. In FIG. 4, the electrostatic chuck 13 was connected to a power supply 21. Following positioning of a wafer 17 on top of the electrostatic chuck 13, a direct current voltage of ±10 kV was applied for 10 minutes, and the chuck was inspected for dielectric breakdown. The results are shown in Table 1.

Comparative Example 1

With the exceptions of not forming the second insulating layer 8 and the adhesive layer 7, an electrostatic chuck was produced in the same manner as the example 1. In this case, instead of applying the primer C to the polyimide film side of the laminated composite sheet comprising the first insulating layer 4, the conductive pattern 6, and the second insulating layer 8, the primer C was applied to the conductive pattern side of a laminated composite sheet comprising the first insulating layer 4 and the conductive pattern 6.

Comparative Example 2

With the exceptions of not forming the second insulating layer 8 and the adhesive layer 7, an electrostatic chuck was produced in the same manner as the example 2. In this case, in a similar manner to the comparative example 1, instead of applying the primer C to the polyimide film side of the laminated composite sheet comprising the first insulating layer 4, the conductive pattern 6, and the second insulating layer 8, the primer C was applied to the conductive pattern side of a laminated composite sheet comprising the first insulating layer 4 and the conductive pattern 6.

[Evaluation of the Electrostatic Chucks of the Comparative Examples 1 and 2]

The cooling performance and insulation performance of the electrostatic chucks obtained in the comparative examples 1 and 2 were evaluated in the same manner as the electrostatic chuck evaluations conducted for the examples 1 to 3. The results are shown in Table 2.

TABLE 1

|  | Example 1 | Example 2 | Example 3 |
|---|---|---|---|
| *Electrostatic Chuck Configuration* | | | |
| Third insulating layer 10 | TC-20A | Heat conductive silicone rubber A | TC-20A |
| Thickness (μm) | 200 | 250 | 200 |
| Thermal conductivity (W/mK) | 1.1 | 0.9 | 1.1 |
| Hardness | 70 | 65 | 70 |
| Surface roughness (μm) | 2 | 3 | 2 |
| Adhesive layer 9 | Primer C | Primer C | Primer C |
| Second insulating layer 8 | Polyimide film (Kapton (R)) | Polyimide film (Apical (R)) | Polyimide film (Kapton (R)) |
| Thickness | 12.5 μm | 25 μm | 12.5 μm |
| Adhesive layer 7 | KE1825 | KE1800ABC | KE1862 |
| Conductive pattern 6 | Electrolytic copper foil | Aluminum foil | Electrolytic copper foil |
| Thickness (μm) | 35 | 50 | 35 |
| Adhesive layer 5 | Primer No. 24T | Primer No. 24T | Primer No. 24T |
| First insulating layer 4 | TC-65BG | TC-65BG | TC-65BG |
| Thickness (μm) | 650 | 650 | 650 |
| Thermal conductivity (W/mK) | 4 | 4 | 4 |
| Adhesive layer 3 | KE1825 | KE1800ABC | KE1862 |
| Metal substrate 2 | Aluminum | Aluminum surface treated with alumite | Aluminum |
| Lead wires 11a and 11b | PTFE-coated wire | PFA-coated wire | PTFE-coated wire |
| Sealing agent 12 | Semicoat 114A | KJR632 | Semicoat 114A |
| *Measurement results* | | | |
| Wafer temperature (° C.) | 60 | 61 | 57 |
| Occurrence of dielectric breakdown (direct current voltage ±10 kV, 10 minutes) | No dielectric breakdown occurred | No dielectric breakdown occurred | No dielectric breakdown occurred |

TABLE 2

|  | Comparative Example 1 | Comparative Example 2 |
|---|---|---|
| *Electrostatic Chuck Configuration* | | |
| Third insulating layer 10 | TC-20A | Heat conductive silicone rubber A |
| Thickness (μm) | 200 | 250 |
| Thermal conductivity (W/mK) | 1.1 | 0.9 |
| Hardness | 70 | 65 |
| Surface roughness (μm) | 2 | 3 |
| Adhesive layer 9 | Primer C | Primer C |
| Conductive pattern 6 | Electrolytic copper foil | Aluminum foil |
| Thickness (μm) | 35 | 50 |
| Adhesive layer 5 | Primer No. 24T | Primer No. 24T |
| First insulating layer 4 | TC-65BG | TC-65BG |
| Thickness (μm) | 650 | 650 |
| Thermal conductivity (W/mK) | 4 | 4 |
| Adhesive layer 3 | KE1825 | KE1800ABC |
| Metal substrate 2 | Aluminum | Aluminum surface treated with alumite |

TABLE 2-continued

|  | Comparative Example 1 | Comparative Example 2 |
|---|---|---|
| Lead wires 11a and 11b | PTFE-coated wire | PFA-coated wire |
| Sealing agent 12 | Semicoat 114A | KJR632 |
| | Measurement results | |
| Wafer temperature (° C.) | 55 | 57 |
| Occurrence of dielectric breakdown (direct current voltage ±10 kV, 10 minutes) | Dielectric breakdown occurred within third insulating layer 10 | Dielectric breakdown occurred within third insulating layer 10 |

[Evaluations]

There were no significant differences between the cooling performance of the electrostatic chucks of the examples and the electrostatic chucks of the comparative examples, confirming that the electrostatic chucks of the present invention exhibit excellent cooling performance levels. Furthermore, the electrostatic chucks of the examples also exhibited excellent plasma resistance.

In the evaluations of insulation performance, the electrostatic chucks of the examples suffered no dielectric breakdown, as can be seen in Table 1, whereas the electrostatic chucks of the comparative examples suffered dielectric breakdown within the third insulating layer. These results confirm that the electrostatic chucks of the examples offer superior levels of insulation performance.

What is claimed is:

1. An electrostatic chuck, comprising:
   a first insulating layer comprising a heat conductive silicone rubber with a thermal conductivity of at least 0.2 W/mK, which is formed on top of a metal substrate, either directly or with an adhesive layer disposed therebetween,
   a conductive pattern, which is formed on top of said first insulating layer, either directly or with an adhesive layer disposed therebetween,
   a second insulating layer comprising an insulating polyimide film, which is formed on top of said conductive pattern, either directly or with an adhesive layer disposed therebetween, and
   a third insulating layer comprising a heat conductive silicone rubber with a thermal conductivity of at least 0.2 W/mK, a hardness of no more than 85, and a surface roughness of no more than 5 μm, which is formed on top of said second insulating layer, either directly or with an adhesive layer disposed therebetween.

2. The electrostatic chuck according to claim 1, wherein at least one of said four adhesive layers is provided, said adhesive layer comprises either a silicone rubber-based adhesive, or a primer containing a silane coupling agent or a titanium-based coupling agent, and a thickness of said adhesive layer is within a range from 0.1 to 30 μm.

3. The electrostatic chuck according to claim 1, wherein at least one of said four adhesive layers is provided, and said adhesive layer comprises at least one thermal conductivity imparting agent selected from the group consisting of alumina, silicon nitride, aluminum nitride, boron nitride, magnesium oxide, and quartz powder.

4. The electrostatic chuck according to claim 1, wherein a thickness of said second insulating layer is within a range from 5 to 50 μm.

5. A process for holding a substrate on an electrostatic chuck, comprising the steps of:
   providing an electrostatic chuck, comprising:
   a first insulating layer comprising a heat conductive silicone rubber with a thermal conductivity of at least 0.2 W/mK, which is formed on top of a metal substrate, either directly or with an adhesive layer disposed therebetween,
   a conductive pattern, which is formed on top of said first insulating layer, either directly or with an adhesive layer disposed therebetween,
   a second insulating layer comprising an insulating polyimide film, which is formed on top of said conductive pattern, either directly or with an adhesive layer disposed therebetween, and
   a third insulating layer comprising a heat conductive silicone rubber with a thermal conductivity of at least 0.2 W/mK, a hardness of no more than 85, and a surface roughness of no more than 5 μm, which is formed on top of said second insulating layer, either directly or with an adhesive layer disposed therebetween;
   positioning said substrate on the surface of said third insulating layer opposite to said second layer; and
   supplying a voltage to said conductive pattern, thereby holding said substrate on said electrostatic chuck.

6. The process according to claim 5, wherein said substrate is a silicon wafer.

* * * * *